US009231512B2

(12) United States Patent
Gao et al.

(10) Patent No.: US 9,231,512 B2
(45) Date of Patent: Jan. 5, 2016

(54) SYSTEMS, METHODS, AND DEVICES FOR DEMODULATING INDUCTION MOTOR INSTANTANEOUS ROTOR SLOT HARMONIC FREQUENCY (75) Inventors: Zhi Gao, Wake Forest, NC (US); Larry A. Turner, Chapel Hill, NC (US); Benoit Leprettre, Latronche (FR); Roy S. Colby, Raleigh, NC (US)

(73) Assignee: SCHNEIDER ELECTRIC USA, INC., Schaumburg, IL (US)

( * ) Notice: Subject to any disclaimer, the term of this patent is extended or adjusted under 35 U.S.C. 154(b) by 1009 days.

(21) Appl. No.: 13/388,556

(22) PCT Filed: Oct. 15, 2011

(86) PCT No.: PCT/US2011/056489
§ 371 (c)(1),
(2), (4) Date: Feb. 2, 2012

(87) PCT Pub. No.: WO2012/058033
PCT Pub. Date: May 3, 2012

(65) Prior Publication Data
US 2012/0153935 A1 Jun. 21, 2012

(51) Int. Cl.
*G01P 3/46* (2006.01)
*H02P 23/14* (2006.01)
*G01R 31/34* (2006.01)
*H02P 21/14* (2006.01)

(52) U.S. Cl.
CPC .............. *H02P 23/14* (2013.01); *G01R 31/343* (2013.01); *H02P 21/146* (2013.01); *H02P 2203/09* (2013.01); *H02P 2207/01* (2013.01)

(58) Field of Classification Search
None
See application file for complete search history.

(56) References Cited

U.S. PATENT DOCUMENTS

| 5,477,162 A | 12/1995 | Heikkila |
| 5,661,386 A | 8/1997 | Kueck et al. |
| 5,689,169 A | 11/1997 | Kerkman et al. |

(Continued)

FOREIGN PATENT DOCUMENTS

EP 2120326 A2 11/2009

OTHER PUBLICATIONS

International Search Report corresponding to co-pending International Patent Application Serial No. PCT/US2011/056489, United States Patent Office, dated Feb. 8, 2012; (3 pages).

(Continued)

*Primary Examiner* — Melissa Koval
*Assistant Examiner* — Stephen G Armstrong
(74) *Attorney, Agent, or Firm* — Locke Lord LLP (57) ABSTRACT A method and apparatus to dynamically and adaptively demodulate induction motor instantaneous rotor slot harmonic frequency for line-connected squirrel-cage polyphase induction motors. The instantaneous rotor slot harmonic frequency carries essential information on the instantaneous rotor speed. Based on a correlation between the motor's input power and its rotor slot harmonic frequency, a dynamically varying carrier frequency is computed and used in a rotor slot harmonic frequency detector. The rotor slot harmonic frequency detector is based on a superheterodyne principle. It contains a generalized linear-phase low-pass filter, whose bandwidth is estimated dynamically by a filter bandwidth estimator. The rotor slot harmonic frequency detector also includes a latency compensator, which receives the dynamically varying carrier frequency signal and synchronizes it with the output of a frequency demodulator.

18 Claims, 8 Drawing Sheets (56) References Cited

U.S. PATENT DOCUMENTS

| | | | |
|---|---|---|---|
| 5,861,728 | A | 1/1999 | Tazawa et al. |
| 5,965,995 | A | 10/1999 | Seibel et al. |
| 6,452,360 | B1 | 9/2002 | Colby |
| 6,636,012 | B2 | 10/2003 | Royak et al. |
| 6,774,664 | B2 | 8/2004 | Godbersen |
| 6,862,538 | B2 | 3/2005 | El-Ibiary |
| 6,876,944 | B2 | 4/2005 | McGaughey et al. |
| 7,135,830 | B2 | 11/2006 | El-Ibiary |
| 7,184,902 | B2 | 2/2007 | El-Ibiary |
| 7,570,074 | B2 | 8/2009 | Gao et al. |
| 2009/0284204 | A1 | 11/2009 | Colby et al. |
| 2009/0284211 | A1 | 11/2009 | Gao et al. |
| 2009/0284212 | A1 | 11/2009 | Turner et al. |
| 2009/0287463 | A1 | 11/2009 | Turner et al. |
| 2011/0313717 | A1* | 12/2011 | Lu et al. ............ 702/147 |

OTHER PUBLICATIONS

International Written Opinion corresponding to co-pending International Patent Application Serial No. PCT/US2011/056489, United States Patent Office, dated Feb. 8, 2012; (7 pages).

Akagi et al., "Instantaneous reactive power compensators comprising switching devices without storage components," *IEEE Transaction on Industry Applications*, vol. 1A-20, No. 3, pp. 625-630, May/Jun. 1984.

Cirrincione et al., "A new experimental application of least-squares techniques for the estimation of the induction motor parameters," *IEEE Transactions on Industry Applications*, vol. 39, No. 5, pp. 1247-1256. Sep./Oct. 2003.

Gao et al., "A sensorless rotor temperature estimator for induction machines based on a current harmonic spectral estimation scheme," *IEEE Transactions on Industrial Electronics*, vol. 55, No. 1, pp. 407-416, Jan. 2008.

Gao et al., "A complex space vector approach to rotor temperature estimation for line-connected induction machines with impaired cooling", *IEEE Transactions on Industrial Electronics*, vol. 56, No. 1, pp. 239-247, Jan. 2009.

Gao et al., "Narrowband angle modulations in induction motor complex current vectors", in *Proceedings of the $7^{th}$ IEEE International Symposium on Diagnostics for Electric Machines, Power Electronics and Drives*, Cargèse, France, Aug. 31-Sep. 3, 2009.

Lu et al., "A nonintrusive and in-service motor-efficiency estimation method using air-gap torque with considerations of condition monitoring", *IEEE Transactions on Industry Applications*, vol. 44, No. 6, pp. 1666-1674, Nov./Dec. 2008.

Oppenheim et al., *Discrete-Time Signal Processing*, $2^{nd}$ ed. Upper Saddle River, NJ: Prentice-Hall, 1999, pp. 347-348.

Peng et al., "Generalized instantaneous reactive power theory for three-phase power systems," *IEEE Transactions on Instrumentation and Measurement*, vol. 45, no. 1, pp. 293-297, Feb. 1996.

Ribeiro et al., "Parameter sensitivity of MRAC models employed in IFO-Controlled AC motor drive ," *IEEE Transactions on Industrial Electronics*, vol. 44, No. 4, pp. 536-545, Aug. 1997.

Stephan et al., "Real-time estimation of the parameters and fluxes of induction motors", *IEEE Transactions on Industry Applications*, vol. 30, No. 3, May/Jun. 1994.

Willems, "A new interpretation of the Akagi-Nabae power components for nonsinusoidal three-phase situations," *IEEE Transactions on Instrumentation and Measurement*, vol. 41, No. 4, pp. 523-527, Aug. 1992.

European Extended Search Report corresponding to co-pending European Patent Application Serial No. 10290582.5, European Patent Office, dated Mar. 18, 201; (8 pages).

Zhi Gao Et Al.; "A Frequency Demodulation Approach to Induction Motor Speed Detection" Dated Sep. 12, 2010; (9 pages).

* cited by examiner

SYSTEMS, METHODS, AND DEVICES FOR DEMODULATING INDUCTION MOTOR INSTANTANEOUS ROTOR SLOT HARMONIC FREQUENCY

CROSS-REFERENCE AND CLAIM OF PRIORITY TO RELATED APPLICATIONS

This application is a U.S. National Phase of International Application No. PCT/US2011/056489, filed on Oct. 15, 2011, which claims the benefit of and priority to European Patent Application No. 10290582.5, filed on Oct. 28, 2010, both of which are incorporated herein by reference in their entireties.

FIELD OF THE INVENTION

The present disclosure relates generally to induction motors, and more particularly to the estimation of instantaneous rotor slot harmonic frequency in polyphase induction motors.

BACKGROUND

Squirrel-cage induction motors are widely used in the agricultural, commercial, municipal, and residential sectors due to their high energy efficiency, reliability, and good controllability. As induction motors become more involved in critical tasks, such as heating, ventilating, and air conditioning (HVAC) systems used in places like hospital intensive-care units (ICU) and energy-efficient buildings, accurate and reliable condition monitoring of their status is assuming a greater importance.

Many induction motor condition monitoring applications require accurate knowledge of instantaneous rotor speed. For example, precise knowledge of the instantaneous rotor speed can be essential for real-time tracking of an induction motor's rotor temperature. The instantaneous rotor speed information may also be required when estimating induction motor electrical parameters, such as stator inductance and total leakage factor. Furthermore, instantaneous rotor speed information can also be used when assessing in-service induction motor's energy efficiency in a non-intrusive manner.

In the absence of dedicated speed sensors, the instantaneous rotor speed can be estimated by extracting a rotor-speed-dependent instantaneous rotor slot harmonic frequency from electrical current measurements. For example, some approaches are based on a superheterodyne principle and use a fixed nominal rotor slot harmonic frequency as a carrier frequency, and a predetermined filter bandwidth when demodulating the instantaneous rotor slot harmonic frequency signal. This approach is generally limited to motor applications involving a fixed average load and hence fixed average rotor speed, or motor applications with moderate rotor speed oscillation superimposed on the fixed average rotor speed.

However, many motor applications, such as conveyor belt applications in postal sorting offices and airport terminals, involve significant rotor speed fluctuations. In these types of applications, the average rotor speed is no longer a constant value. Rotor speed fluctuations may cause rotor-speed-dependent instantaneous rotor slot harmonic frequency to deviate considerably from the fixed nominal rotor slot harmonic frequency. In addition, many other motor applications, such as applications in refrigeration and industrial processes with reciprocating compressors, may contain pulsating speed components whose frequencies are larger than the predetermined filter bandwidth in the rotor slot harmonics. Use of digital filters with predetermined filter bandwidth may result in the exclusion of these pulsating components in the rotor slot harmonics. Both rotor speed fluctuations and load-induced rotor speed pulsations lead to distortions in the estimated instantaneous rotor slot harmonic frequency, and hence distortions in an estimated instantaneous rotor speed.

SUMMARY

Systems, methods, and devices are disclosed herein to accurately track the instantaneous rotor slot harmonic frequency for motors with both rotor speed fluctuations and load-induced rotor speed pulsations. In some embodiments, methods are disclosed that utilize correlations between a motor's input power and speed to establish a relationship between the motor's input power and anticipated rotor slot harmonic frequency. As a result, a dynamically varying carrier frequency is generated when demodulating the rotor slot harmonic frequency. These approaches are robust against rotor speed fluctuations and/or load-induced rotor speed pulsations.

Systems, methods, and devices are disclosed that produce a generalized linear-phase low-pass filter by examining the frequency spectrum of a normalized residual power. Because the normalized residual power is closely associated with the load-induced rotor speed pulsations, the bandwidth of the generalized linear-phase low-pass filter can be dynamically sized based on the frequency spectrum of the normalized residual power, and thus provide good signal filtering capability without excluding necessary speed-related information or including unnecessary noises or interferences in the final estimated instantaneous rotor slot harmonic frequency.

Systems, methods, and devices are also disclosed that automatically adjust the carrier frequency in a rotor slot harmonic frequency detector. In some embodiments, the rotor slot harmonic frequency detector is based on a superheterodyne principle. Some configurations provide for the automatic selection of appropriate bandwidth for a generalized linear-phase low-pass filter used in the rotor slot harmonic frequency detector.

According to one aspect of the present disclosure, a method for demodulating instantaneous rotor slot harmonic frequency for a polyphase induction motor is presented. The method includes: receiving measurements indicative of at least one voltage and at least one current associated with the induction motor; converting the voltage measurements to discrete-time voltage samples and the current measurements to discrete-time current samples; determining a complex voltage from the discrete-time voltage samples and a complex current from the discrete-time current samples; receiving motor nameplate data associated with the motor; determining a dynamically varying carrier frequency; determining an estimated filter bandwidth; demodulating the instantaneous rotor slot harmonic frequency based, at least in part, on the dynamically varying carrier frequency, the estimated filter bandwidth, and the motor nameplate data; and storing the demodulated instantaneous rotor slot harmonic frequency.

In accordance with yet another aspect of the present disclosure, a method is presented for demodulating instantaneous rotor slot harmonic frequency for line-connected squirrel-cage polyphase induction motors. The demodulation is based on voltage and current measurements readily available at motor control centers or motor terminals. Continuous tracking of the instantaneous rotor slot harmonic frequency is provided during either steady-state or dynamic motor operations. No speed sensors are needed—thus, this approach is suitable for many line-connected motor applications with rotor speed fluctuations and/or load-induced rotor speed pulsations present. The method comprises measuring voltages and currents associated with the induction motor; converting these measurements into discrete-time voltage samples and discrete-time current samples, e.g., via analog-to-digital converters. The voltages can be measured, for example, between two phases or between any phase and an arbitrary voltage reference point determined by the measurement device. The currents can be measured, for example, from two phases or from all three phases. The method also includes synthesizing a complex voltage from the discrete-time voltage samples, and synthesizing a complex current from the discrete-time current samples. The complex voltage and current represent an induction motor's operating condition. The method further comprises acquiring and storing motor nameplate data. Information from the motor nameplate data can be used jointly with the complex voltage and current in subsequent stages. In addition to the foregoing, the method also includes: calculating a dynamically varying carrier frequency based on the complex voltage, the complex current, and the motor nameplate data according to a correlation between the motor's input power and the motor's rotor slot harmonic frequency; and determining an estimated filter bandwidth by examining the frequency spectrum of a normalized residual power computed from the complex voltage and current. This estimated filter bandwidth is used in the subsequent rotor slot harmonic frequency detector. The method also includes demodulating the instantaneous rotor slot harmonic frequency via a rotor slot harmonic frequency detector.

In accordance with another aspect of the present disclosure, one or more machine-readable non-transitory storage media are encoded with instructions which, when executed by one or more processors, cause the one or more processors to perform any of the above or below methods.

The above summary is not intended to represent each embodiment or every aspect of the present disclosure. Rather, the foregoing summary merely provides an exemplification of some of the novel features included herein. The above features and advantages, and other features and advantages of the present disclosure, will be readily apparent from the following detailed description of the embodiments and best modes for carrying out the present invention when taken in connection with the accompanying drawings and appended claims.

While the present disclosure is susceptible to various modifications and alternative forms, specific embodiments have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

While the present disclosure is susceptible of embodiment in many different forms, there are shown in the drawings and will herein be described in detail representative embodiments of the disclosure with the understanding that the present disclosure is to be considered as an exemplification of the various aspects and principles of the invention, and is not intended to limit the broad aspect of the invention to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise.

Figure 1:
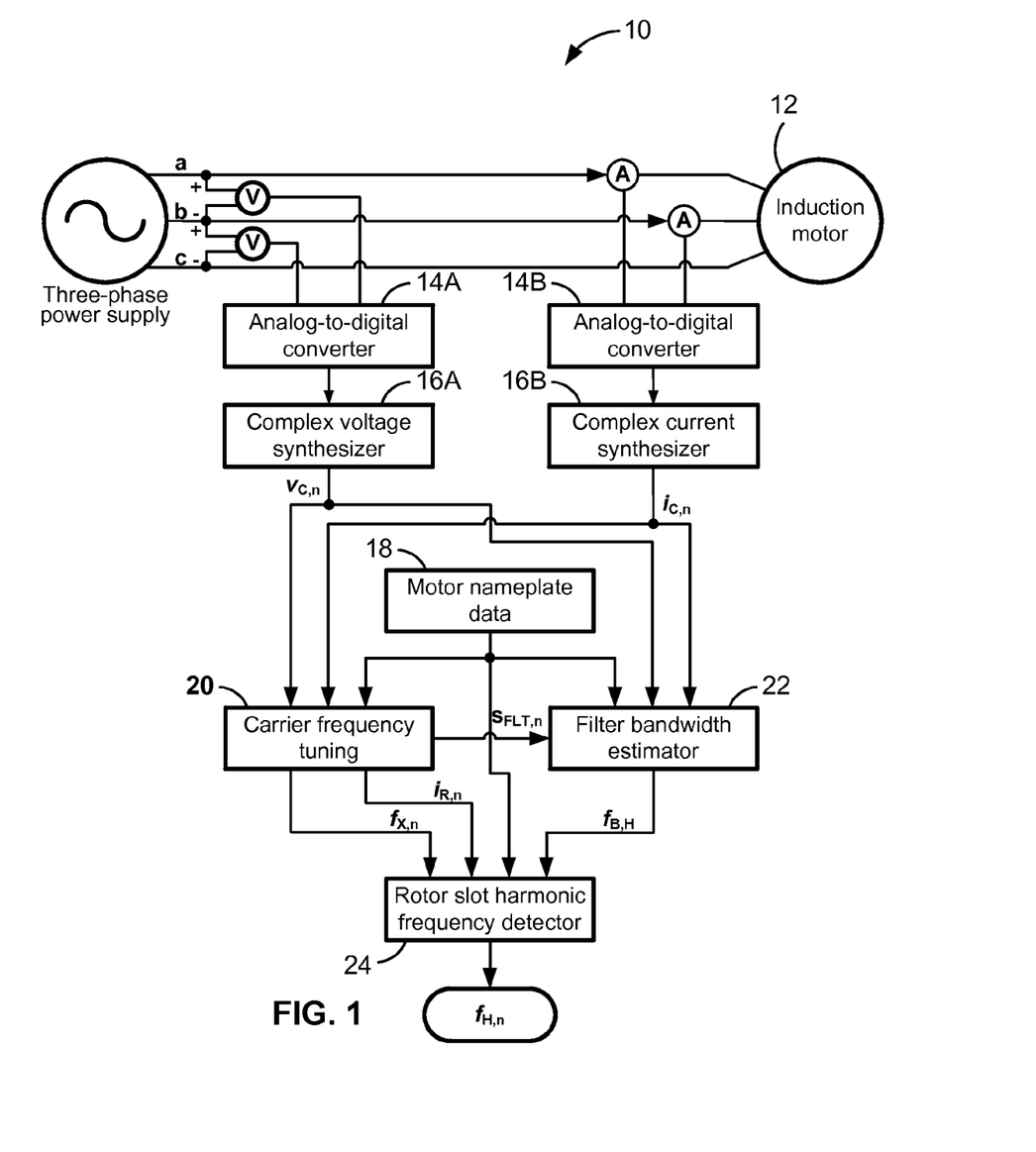
FIG. 1 is a schematic block diagram showing the overall architecture of an exemplary apparatus for demodulating the instantaneous rotor slot harmonic frequency of an induction motor.

According to aspects of the present disclosure, systems, methods, and devices are disclosed that accurately track the instantaneous rotor slot harmonic frequency for motors with both rotor speed fluctuations and load-induced rotor speed pulsations. In some embodiments, methods and devices are disclosed that utilize correlations between a motor's input power and speed to establish a relationship between the motor's input power and anticipated rotor slot harmonic frequency. As a result, a dynamically varying carrier frequency is generated when demodulating the rotor slot harmonic frequency. These approaches are generally impervious to rotor speed fluctuations and/or load-induced rotor speed pulsations Referring now to the drawings, wherein like reference numerals refer to like components throughout the several views, FIG. 1 is a schematic block diagram showing the overall architecture of an exemplary device or apparatus, designated generally as 10, for dynamically and adaptively estimating and/or demodulating the instantaneous rotor slot harmonic frequency of an induction motor, schematically illustrated at 12. In the illustrated embodiment, there are six primary stages: (1) voltage and current measurements are taken, for example, with analog-to-digital converters 14A and 14B; (2) complex voltage and complex current are generated, for example, by respective synthesizers 16A and 16B; (3) motor nameplate data are acquired and stored, for example, in memory 18; (4) a dynamically varying carrier frequency is produced, for example, during a carrier frequency tuning stage 20; (5) an estimated filter bandwidth is produced, for example, by a filter bandwidth estimator 22; and (6) the instantaneous rotor slot harmonic frequency is demodulated, for example, by a rotor slot harmonic frequency detector 24. Each of these segments is described in detail below.

Voltage and Current Measurements

For a line-connected polyphase induction motor with a floating neutral point, the first and second analog-to-digital converters 14A, 14B are operable to convert voltage and current waveforms, respectively, which can be measured among different phases, to discrete-time voltage and current samples at a sampling frequency, $f_S$, which is measured in hertz (Hz). For example, FIG. 1 shows that two voltage samples, $v_{ab,n}$ and $v_{bc,n}$, are acquired along with two current samples, $i_{a,n}$ and $i_{b,n}$. The subscript "n" denotes a temporal index, i.e., the nth sample, in a discrete-time system. In some embodiments, the voltages are typically measured either from two phases with respect to a third phase, or from two phases with respect to an arbitrary voltage reference point determined by the measurement device. The currents are typically measured either from two phases or from all three phases Complex Voltage and Complex Current A complex voltage, $v_{C,n}$, which is measured in volts (V), is synthesized from the acquired discrete-time voltage samples via complex voltage synthesizer 16A. It is a sequence of complex numbers carrying frequency information between $-f_S/2$ and $f_S/2$. Similarly, a complex current, $i_{C,n}$, which is measured in amperes or amps (A), is synthesized from the acquired discrete-time current samples via complex current synthesizer 16B. The complex voltage, $v_{C,n}$, and current, $i_{C,n}$, represent an induction motor's operating condition.

Complex Voltage Synthesizer

In some embodiments, the complex voltage, $v_{C,n}$, is synthesized from the acquired voltage samples by a complex voltage synthesizer 16A. Table I (below) shows the detailed relationship between the complex voltage synthesizer's input and output. In Table I, acquired voltage samples are denoted by a symbol X. The quantity $\alpha=\exp(j\cdot 2\pi/3)$ is a constant; j is the imaginary unit; $\exp(\cdot)$ denotes an exponential function; $v_{ab,n}$ denotes the voltage of phase a with respect to phase b; $v_{bc,n}$ denotes the voltage of phase b with respect to phase c; $v_{ca,n}$ denotes the voltage of phase c with respect to phase a. The subscript o denotes an arbitrary voltage reference point selected by the measurement device. For example, given two acquired voltage samples, $v_{ab,n}$ and $v_{bc,n}$, the complex voltage, $v_{C,n}$, is synthesized by $v_{C,n}=\frac{2}{3}\cdot(v_{ab,n}-\alpha^2\cdot v_{bc,n})$ according to Case 1 in Table I. Alternative quantities may be measured and converted in a similar fashion.

TABLE I

Complex Voltage Synthesizer

| Case | $v_{ab,n}$ | $v_{bc,n}$ | $v_{ca,n}$ | $v_{ao,n}$ | $v_{bo,n}$ | $v_{co,n}$ | Output |
|---|---|---|---|---|---|---|---|
| 1 | X | X | | | | | $v_{C,n}=\frac{2}{3}\cdot(v_{ab,n}-\alpha^2\cdot v_{bc,n})$ |
| 2 | | X | X | | | | $v_{C,n}=\frac{2}{3}\cdot(\alpha\cdot v_{bc,n}-v_{ca,n})$ |
| 3 | X | | X | | | | $v_{C,n}=\frac{2}{3}\cdot(-\alpha\cdot v_{ab,n}+\alpha^2\cdot v_{ca,n})$ |

TABLE I-continued

Complex Voltage Synthesizer

| Case | $v_{ab,n}$ | $v_{bc,n}$ | $v_{ca,n}$ | $v_{ao,n}$ | $v_{bo,n}$ | $v_{co,n}$ | Output |
|---|---|---|---|---|---|---|---|
| 4 | | | | X | X | X | $v_{C,n}=\frac{2}{3}\cdot(v_{ao,n}+\alpha\cdot v_{bo,n}+\alpha^2\cdot v_{co,n})$ |

Complex Current Synthesizer

In some embodiments, the complex current, $i_{C,n}$, is synthesized from the acquired current samples by a complex current synthesizer. Table II (below) shows the detailed relationship between the complex current synthesizer's input and output. Similar to the notation used above in Table I, acquired current samples are denoted by the symbol X in Table II. Phase a, b and c current samples are denoted by $i_{a,n}$, $i_{b,n}$, and $i_{c,n}$, respectively. For example, given two acquired current samples $i_{a,n}$ and $i_{b,n}$, the complex current $i_{C,n}$ is synthesized by $i_{C,n}=\frac{2}{3}\cdot[(2+\alpha)\cdot i_{a,n}+(1+2\alpha)\cdot i_{b,n}]$ according to Case 1 in Table II. Alternative quantities may be measured and converted in a similar fashion.

TABLE II

Complex Current Synthesizer

| Case | $i_{a,n}$ | $i_{b,n}$ | $i_{c,n}$ | Output |
|---|---|---|---|---|
| 1 | X | X | | $i_{C,n}=\frac{2}{3}\cdot[(2+\alpha)\cdot i_{a,n}+(1+2\alpha)\cdot i_{b,n}]$ |
| 2 | | X | X | $i_{C,n}=\frac{2}{3}\cdot[(-1+\alpha)\cdot i_{b,n}+(-2-\alpha)\cdot i_{c,n}]$ |
| 3 | X | | X | $i_{C,n}=\frac{2}{3}\cdot[(1-\alpha)\cdot i_{a,n}+(-1-2\alpha)\cdot i_{c,n}]$ |
| 4 | X | X | X | $i_{C,n}=\frac{2}{3}\cdot(i_{a,n}+\alpha\cdot i_{b,n}+\alpha^2\cdot i_{c,n})$ |

Motor Nameplate Data

According to some aspects of the present disclosure, motor nameplate data is acquired and/or stored in memory 18. The motor nameplate data provides information that is used for demodulating induction motor rotor slot harmonic frequency. Such data can be extracted either directly from information provided by the manufacturer on the nameplate of a specific motor, or indirectly from other available sources, such as the manufacturer's website. Motor nameplates can include information like rated voltage(s), rated full-load amps for each voltage level frame size, rated frequency, number of phases, rated horsepower, rated speed, time rating, rated condition, National Electrical Manufacturers Association (NEMA) design letter, service factor, full-load efficiency, power factor, etc.

The rated condition refers to a state of motor operation explicitly defined by a specified stator voltage, stator current, and supply frequency. Information on the rated condition can be found on the motor nameplate. The rated voltage, $v_0$, which is typically measured in volts (V), is the root mean square (rms) stator voltage, necessary for motor operating at the rated condition. The rated current, $i_0$, which is typically measured in amperes (amps or A), is the rms stator current resulting from motor operation at the rated condition. The rated fundamental frequency, $f_0$, which is typically measured in hertz (Hz), is the supply frequency necessary for motor operation at the rated condition. The rated fundamental frequency is also known as the utility frequency in power generation, transmission, and distribution systems. It is the frequency at which alternating current is transmitted from power plants to end users. In the U.S., for example, the rated fundamental frequency is 60 Hz, while in many other parts of the world it is 50 Hz.

The rated speed, $r_0$, which is typically measured in revolutions per minute (RPM), is the rotor speed resulting from motor operation at the rated condition. The number of pole-pairs, P, is a design parameter. This quantity is generally not specified on the motor nameplate, but can be deduced from the rated speed $r_0$ and the rated fundamental frequency $f_0$ via:

$$P=\text{floor}(60 \cdot f_0/r_0) \quad (1)$$

where floor(·) refers to the rounding of a real number to the nearest integer that is less than or equal to it.

The number of rotor slots, R, is another design parameter. For squirrel-cage induction motors, the number of rotor slots is equal to the number of longitudinal conductive bars, typically made of aluminum or copper, along the circumference of a cylinder-shaped rotor.

The rated slip, $s_0$, is the slip at rated condition. It is computed from the rated fundamental frequency, $f_0$, the rated speed, $r_0$, and the number of pole-pairs, P, via:

$$s_0 = 1 - P \cdot r_0/(60 \cdot f_0) \quad (2)$$

The rated power factor, $PF_0$, is the power factor when the motor operates at the rated condition. In some cases, it is also marked as cos φ on the motor nameplate. The rated input power, $P_{IN,0}$, which is typically measured in watts (W), is the motor's input power when it operates at rated condition. It can be computed from the rated voltage, $v_0$, the rated current, $i_0$, and the rated power factor, $PF_0$, via:

$$P_{IN,0} = \text{sqrt}(3) \cdot v_0 \cdot i_0 \cdot PF_0 \quad (3)$$

where sqrt(·) denotes the square root operation.

The rated output power, $P_{OUT,0}$, which can be measured in horsepower (hp), is the motor's output power at the rated condition. The rated efficiency, $\eta_0$, is the motor's efficiency when converting input power to output power at the rated condition. This quantity should be identical to the motor nameplate efficiency. If the motor nameplate efficiency is not available, then the rated efficiency $\eta_0$ is loosely associated with the rated voltage $v_0$, the rated current $i_0$, the rated power factor, $PF_0$, and the rated output power, $P_{OUT,0}$, via:

$$\eta_0 = (746 \cdot P_{OUT,0})/[\text{sqrt}(3) \cdot v_0 \cdot i_0 \cdot PF_0] \quad (4)$$

For example, the nameplate data for a 15-hp motor shows a rated voltage of $v_0=460$ V, a rated current of $i_0=18.7$ A, a rated fundamental frequency of $f_0=60$ Hz, and a rated speed of $r_0=1180$ r/min. According to equation (1), above, the number of pole-pairs for this motor is P=3. The motor has 44 rotor slots, i.e., R=44. The rated slip for a 15-hp motor is $s_0=0.0167$, the rated power factor is $PF_0=0.81$, i.e., 81%. Consequently, the rated input power is $P_{IN,0}=1.207\times10^4$ W according to equation (3), above. The rated output power is $P_{OUT,0}=15$ hp, and the rated efficiency is $\eta_0=0.924$, i.e., 92.4%.

Carrier Frequency Tuning

Nominal rotor slot harmonic frequency, $f_D$, is typically used as a fixed carrier frequency to demodulate the instantaneous rotor slot harmonic frequency from the complex current, $i_{C,n}$. Examples of such applications can be found in U.S. Pat. No. 7,769,552 B2, to Roy S. Colby et al., which issued on Aug. 3, 2010 and is entitled "Method and Apparatus for Estimating Induction Motor Rotor Temperature," and U.S. Patent Application Publication No. 2009/0284212 A1, to Larry A. Turner et al., which published on Nov. 19, 2009 and is entitled "Methods and Apparatuses for Estimating Transient Slip," both of which are incorporated herein by reference in their respective entireties. Schemes that utilize a fixed carrier frequency to demodulate the instantaneous rotor slot harmonic frequency are generally suitable for motor applications with a fixed average load and, hence, a fixed average speed, i.e. load and speed that on average do not change significantly over the time. There are, however, many motor applications that involve significant rotor speed fluctuations; in these applications, induction motor rotor speed drifts as a result of rotor speed fluctuations, leading to variations in the rotor-speed-dependent rotor slot harmonic frequency. In certain cases, the rotor slot harmonic frequency may be significantly different from the fixed carrier frequency, thus limiting the capability of fixed-carrier-frequency dependent rotor slot harmonic frequency extraction methods to accurately and continuously demodulate the instantaneous rotor slot harmonic frequency.

In some embodiments of the present disclosure, the carrier frequency is not fixed but rather is dynamically varied to ensure that the instantaneous rotor slot harmonic frequency is precisely and continuously demodulated even when significant rotor speed fluctuations are present. In the carrier frequency tuning stage 20 of FIG. 1, for example, the carrier frequency is dynamically adjusted by calculating an anticipated rotor slot harmonic frequency, $f_{X,n}$ (in hertz), based on a correlation between the input power and the rotor slot harmonic frequency of the motor.

Figure 2:
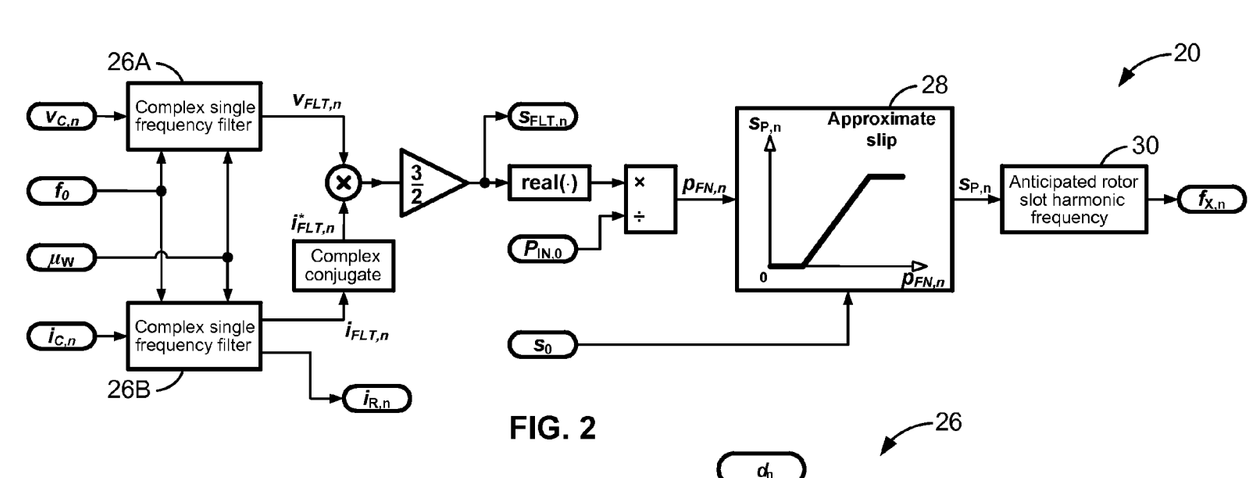
FIG. 2 is a schematic block diagram showing the structure of an exemplary carrier frequency tuning stage.

FIG. 2 is a schematic block diagram showing the structure of an exemplary carrier frequency tuning stage. The embodiment illustrated in FIG. 2 comprises four subsystems: (1) adaptive filtering; (2) normalized input power; (3) approximate slip; and (4) anticipated rotor slot harmonic frequency. By taking the complex voltage, $v_{C,n}$, the complex current, $i_{C,n}$, the rated slip $s_0$, and the rated input power $P_{IN,0}$ as inputs, the carrier frequency tuning stage 20 produces the anticipated rotor slot harmonic frequency $f_{X,n}$, a complex residual current, $i_{R,n}$, which is typically measured in amperes (A), and a complex filtered power, $s_{FLT,n}$, which is typically measured in Volt-Amps (VA), as outputs.

When load fluctuates, the anticipated rotor slot harmonic frequency $f_{X,n}$ shifts accordingly. In some embodiments of the present disclosure, the anticipated rotor slot harmonic frequency $f_{X,n}$ is tuned to match the average rotor slot harmonic frequency. By providing this dynamically varying frequency as the carrier frequency to the subsequent rotor slot harmonic frequency detector, the carrier frequency tuning stage enables a precise and continuous frequency demodulation, even in the presence of significant rotor speed fluctuations.

Adaptive Filtering

With reference to FIG. 2, the adaptive filtering subsystem of the carrier frequency tuning stage 20 utilizes two complex single frequency (CSF) filters 26A and 26B to process the complex voltage $v_{C,n}$ and the complex current $i_{C,n}$, respectively. The first CSF filter 26A produces a complex filtered voltage, $v_{FLT,n}$, which is typically measure in volts (V), whereas the second CSF filter 26B produces a complex filtered current, $i_{FLT,n}$, and a complex residual current, $i_{R,n}$ which are typically measured in amperes (A).

Figure 3:
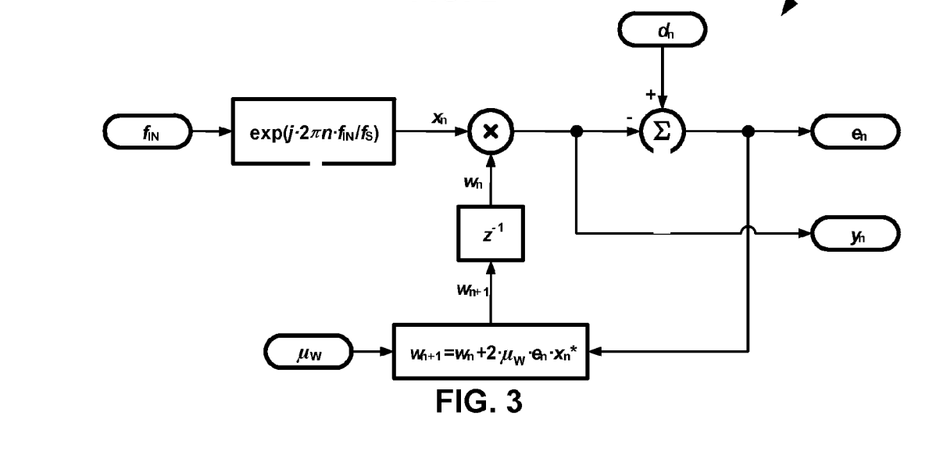
FIG. 3 is a schematic block diagram showing the structure of an exemplary complex single frequency filter.

The structure of an exemplary CSF filter 26 is shown in FIG. 3, where $z^{-1}$ denotes a one-sample delay in the z-transform. The CSF filter 26 synthesizes a single-frequency complex exponential signal, $x_n$, from a synthesis frequency, $f_{IN}$, which is typically measured in hertz (Hz), via:

$$x_n = \exp(j \cdot 2\pi n \cdot f_{IN}/f_S) \quad (5)$$

A complex reference signal, $y_n$, is obtained by multiplying the single-frequency complex exponential signal $x_n$ with a complex coefficient, $w_n$. A complex error signal, $e_n$, is shown as the difference between a complex primary signal, $d_n$, and the complex reference signal $y_n$.

The complex coefficient, $w_n$, is iteratively updated via:

$$w_{n+1} = w_n + 2 \cdot \mu_W \cdot e_n \cdot x_n^* \quad (6)$$

where $\mu_W$ is a small positive number called coefficient adaptation rate. The complex coefficient $w_n$ is typically initialized to zero, i.e., $w_0=0$. This zero complex coefficient $w_0$, however, can cause the CSF filter 26 to have a start-up transient. This start-up transient can be addressed simply by discarding the output of the CSF filter 26 that corresponds to the start-up transient.

Figure 4:
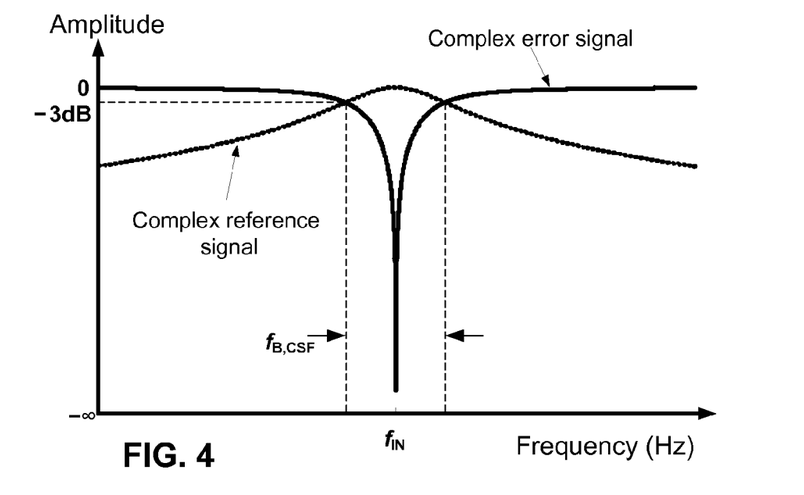
FIG. 4 is a graph showing the bandwidth of an exemplary complex single frequency filter in a frequency spectrum.

The CSF filter 26 dynamically resolves the magnitude and phase of a signal at the synthesis frequency $f_{IN}$ from the complex primary signal $d_n$. Compared to conventional filters with static topologies, such as discrete-time finite impulse response (FIR) filters or infinite impulse response (IIR) filters, the CSF filter 26 offers superior performance because it is computationally simple and tunable to any observable frequency of interest. The CSF filter 26 can be regarded as high-quality adaptive band-reject or band-pass filters with controllable bandwidth. FIG. 4 graphically depicts the bandwidth of an exemplary CSF filter in a frequency spectrum. FIG. 4 shows the spectra of both the complex reference signal $y_n$ and the complex error signal $e_n$. A CSF filter bandwidth, $f_{B,CSF}$, which is typically measured in hertz (Hz), is determined by the coefficient adaptation rate $\mu_W$ via:

$$f_{B,CSF} = (2 \mu_W f_S)/\pi \quad (7)$$

For example, given a sampling frequency of $f_S=5$ kHz, and a coefficient adaptation rate of $\mu_W = \pi \times 10^{-5}$, the CSF filter bandwidth is $f_{B,CSF}=0.1$ Hz.

The CSF filter bandwidth $f_{B,CSF}$ illustrated in FIG. 4 effectively determines how fast the carrier frequency is adjusted to reflect fluctuations in rotor speed. The coefficient adaptation rate $\mu_W$ is also inversely proportional to the convergence, i.e., the time required to find the optimum complex coefficient $w_n$. Furthermore, the coefficient adaptation rate $\mu_W$ is proportional to misadjustment, i.e., the estimation noise introduced by the adaptive process. In some embodiments, a small coefficient adaptation rate $\mu_W$ is chosen to achieve a result with low estimation noise at a cost of slow convergence. In some embodiments, selection of the coefficient adaptation rate $\mu_W$ should be coordinated with the filter bandwidth used in the rotor slot harmonic frequency detector 24. The coordination is addressed in the filter bandwidth estimator stage, discussed below.

In the adaptive filtering subsystem of the carrier frequency tuning stage 20, the first CSF filter 26A of FIG. 2 receives the rated fundamental frequency $f_0$ as the synthesis frequency $f_{IN}$, and the complex voltage $v_{C,n}$ as the complex primary signal $d_n$. The first CSF filter 26A produces the complex filtered voltage $v_{FLT,n}$ as an output. The complex filtered voltage $v_{FLT,n}$ is the complex reference signal $y_n$ in the first CSF filter. The second CSF filter 26B in the adaptive filtering subsystem receives the rated fundamental frequency $f_0$ as the synthesis frequency $f_{IN}$, and the complex current $i_{C,n}$ as the complex primary signal $d_n$. The second CSF filter 26B produces complex filtered current $i_{FLT,n}$ as an output. The complex filtered current $i_{FLT,n}$ is the complex reference signal $y_n$ in the second CSF filter 26B. In addition, the second CSF filter 26B also produces the complex residual current $i_{R,n}$ as an output. The complex residual current $i_{R,n}$ is the complex error signal $e_n$ in the second CSF filter 26B. In some embodiments, the coefficient adaptation rate $\mu_W$ used in the first CSF filter 26A is chosen to be same as the coefficient adaptation rate $\mu_W$ used in the second CSF filter 26B. However, it is possible to use different coefficient adaptation rates $\mu_W$ for each CSF filter 26A, 26B.

For filter group delay, the CSF filter 26 is generally superior to conventional FIR or IIR filters because, in the CSF filter 26, the angles of the poles are almost identical to those of the zeros. In other words, the filter group delay is approximately zero at the synthesis frequency, indicating that there is virtually no time delay between the input and output of the CSF filter 26. In addition, the CSF filter 26 is generally superior to FIR or IIR filters because it does not need to stack numerous zeros of a specific transfer function on top of each other, and hence does not suffer from numerical-precision-related problems in implementation.

Normalized Input Power

With continuing reference to FIG. 2, the normalized input power subsystem of the carrier frequency tuning stage 20 first calculates the complex filtered power $s_{FLT,n}$ by multiplying the complex filtered voltage $v_{FLT,n}$ with the complex conjugate of the complex filtered current $i_{FLT,n}$. A constant coefficient 3/2 is included in the equation so that the complex filtered power $s_{FLT,n}$ corresponds to a 3-phase quantity. The foregoing relationship is presented below in equation (8).

$$s_{FLT,n} = 3/2 \cdot v_{FLT,n} \cdot i_{FLT,n}^* \quad (8)$$

The superscript * in equation (8) denotes the complex conjugate. The normalized input power, $p_{FN,n}$, is the real part of the complex filtered power $s_{FLT,n}$ normalized to the rated input power $P_{IN,0}$, i.e., $$p_{FN,n} = \text{real}(s_{FLT,n})/P_{IN,0} \quad (9)$$

where $\text{real}(\cdot)$ denotes the real part of a complex quantity.

Approximate Slip

The approximate slip subsystem of the carrier frequency tuning stage 20 of FIG. 2 calculates an intermediate slip-related quantity, $z_{P,n}$, from the normalized input power $p_{FN,n}$ via the following relationship:

$$z_{P,n} = C_{T,m,0} + C_{T,m,1} \cdot p_{FN,n} \cdot s_0 \quad (10)$$

where $C_{T,m,0}$ and $C_{T,m,1}$ are motor-specific coefficients. Because the approximate slip usually demonstrates significant temperature dependence, it is often desirable to compensate the motor specific coefficients for temperature variation. Relationship other than (10) may be used instead if higher precision is required when calculating approximate slip.

The coefficients may take different values as necessary. For example, in one exemplary embodiment, $C_{T,m,0}=-1.95\times10^{-3}$ and $C_{T,m,1}=0.8738$ at a temperature, $\theta_{TR,n}$, which can be measured in degrees Celsius (° C.), of 25° C. based on several representative motors. In case the temperature $\theta_{TR,n}$ is different from 25° C., the coefficient $C_{T,m,1}$ can be obtained by evaluating the expression $(2.75\times10^{-3}\cdot\theta_{TR,n}+0.805)$. If the result is less than or equal to 0.805, then $C_{T,m,1}=0.805$. If the result is greater than 0.805, but less than or equal to 1.0, then $C_{T,m,1}=2.75\times10^{-3}\cdot\theta_{TR,n}+0.805$. If the result is greater than 1.0, then $C_{T,m,1}=1.0$. When evaluating the equation $(2.75\times10^{-3}\cdot\theta_{TR,n}+0.805)$, the temperature $\theta_{TR,n}$ may be obtained from a temperature estimate independently provided by a thermal model, or a priori knowledge.

The approximate slip, $s_{P,n}$, is derived from the intermediate slip-related quantity, $z_{P,n}$, via the following relationships: (1) if $z_{P,n} \leq 0$, then $s_{P,n}=0$; (2) if $0 < z_{P,n} \leq 3 \cdot s_0$, then $s_{P,n}=z_{P,n}$; and (3) if $3 \cdot s_0 < z_{P,n}$, then $s_{P,n}=3 \cdot s_0$. The approximate slip component 28 in FIG. 2 illustrates that approximate slip, $s_{P,n}$, is a saturated linear function of the normalized input power $p_{FN,n}$.

Anticipated Rotor Slot Harmonic Frequency

Given certain design parameters of an induction motor, the anticipated rotor slot harmonic frequency subsystem, designated 30 in FIG. 2, can calculate the anticipated rotor slot harmonic frequency, $f_{X,n}$, from the approximate slip, $s_{P,n}$, via:

$$f_{X,n} = \pm f_0 \cdot [(1-s_{P,n}) \cdot kR/P + n_W] \tag{11}$$

where the '+' sign corresponds to cases in which the rotor slot harmonic component has a positive frequency, and the '−' sign corresponds to cases in which the rotor slot harmonic component has a negative frequency; k=1, 2, 3, ..., indicates the rotor magnetomotive force (MMF) distribution harmonic order; $n_W = \pm 1, \pm 3, \pm 5, \ldots$, is the stator winding distribution harmonic order.

Figure 5:
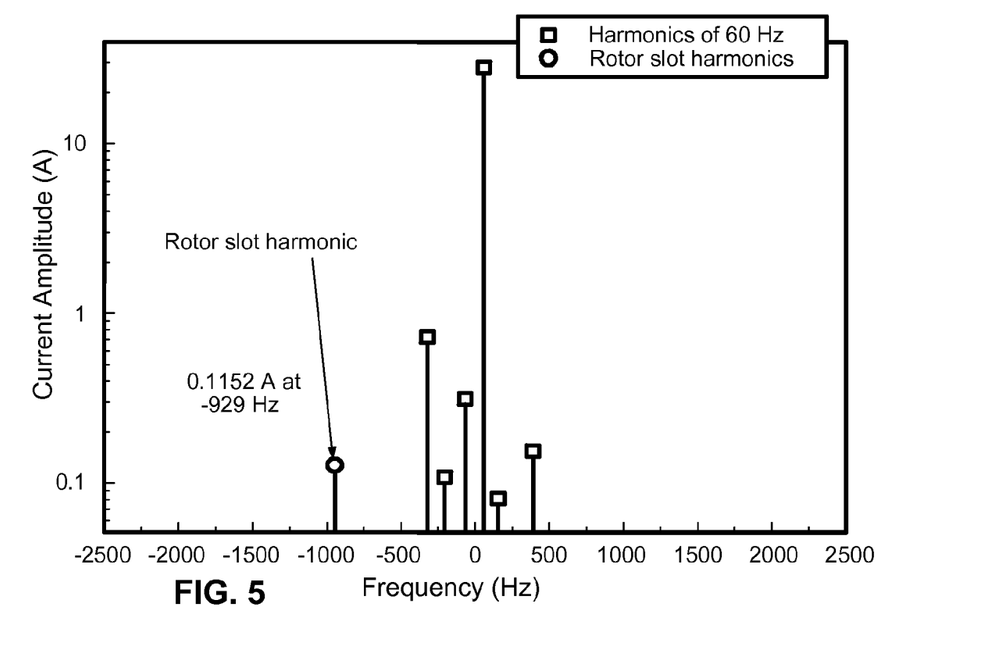
FIG. 5 is a graph showing the frequency spectrum of the complex current for a representative 15-hp 6-pole induction motor with 44 rotor slots.
Figure 6:
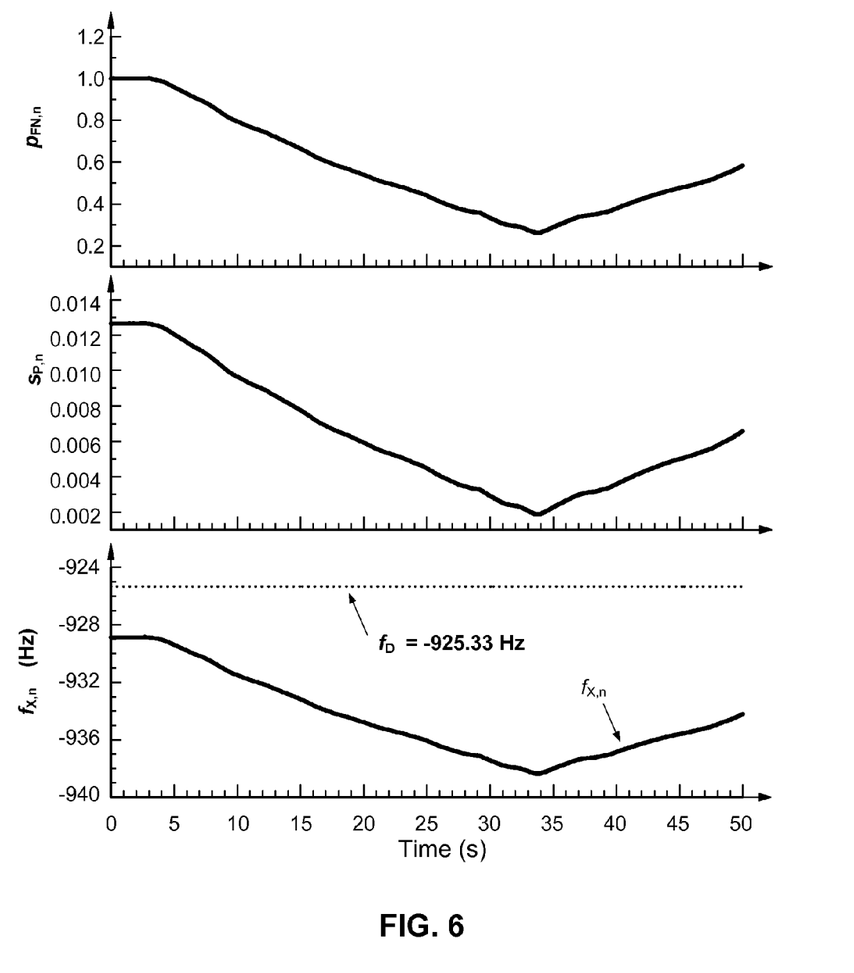
FIG. 6 is a three-part graph plotting an exemplary normalized input power, an exemplary approximate slip, an exemplary anticipated rotor slot harmonic frequency, and an exemplary nominal rotor slot harmonic frequency against time.

The quantities k and $n_W$, along with the '±' sign in equation (11), above, are all related to the design parameters of a specific squirrel-cage induction motor. A detailed discussion of this relationship may be found in U.S. Pat. No. 7,769,552, previously incorporated herein by reference. For example, for the aforementioned exemplary 15-hp motor, a '−' sign is taken because the rotor slot harmonic frequency is negative, the rotor MMF distribution harmonic order k=1, and the stator winding distribution harmonic order $n_W$=1. FIG. 5 shows the frequency spectrum for the complex current for the aforementioned 15-hp motor, and FIG. 6 plots the anticipated rotor slot harmonic frequency, $f_{X,n}$, along with the normalized input power, $p_{FN,n}$, and the approximate slip, $s_{P,n}$, for the same 15-hp motor. For comparison purposes, the nominal rotor slot harmonic frequency, $f_D$, is also plotted in FIG. 6. This nominal rotor slot harmonic frequency, $f_D$, is obtained by replacing the approximate slip $s_{P,n}$ in equation (11) with the rated slip $s_0$ while keeping all other quantities unchanged.

As shown in FIG. 6, using a small coefficient adaptation rate, $\mu_W$, in the adaptive filtering subsystem enables the normalized input power subsystem to generate a dynamically varying normalized input power, $p_{FN,n}$. This normalized input power, $p_{FN,n}$ reflects load fluctuations and, hence, rotor speed fluctuations. In the approximate slip subsystem, the normalized input power, $p_{FN,n}$, translates to the dynamically varying approximate slip, $s_{P,n}$, and consequently to a dynamically varying anticipated rotor slot harmonic frequency, $f_{X,n}$, in the anticipated rotor slot harmonic frequency subsystem. When the dynamically varying anticipated rotor slot harmonic frequency, $f_{X,n}$, is used as the carrier frequency in the subsequent rotor slot harmonic frequency detector, a precise frequency demodulation is achieved even in the presence of significant rotor speed fluctuations. In contrast, the fixed nominal rotor slot harmonic frequency, $f_D$, does not track rotor speed fluctuations in the motor. If this nominal rotor slot harmonic frequency, $f_D$, is used as the carrier frequency, then precise frequency demodulation may be difficult to achieve in the presence of significant rotor speed fluctuations.

Filter Bandwidth Estimator

Harmonics, interferences, and noise, such as power system harmonics and rotor-dynamic-eccentricity-related harmonics, may be found in the neighborhood of the rotor slot harmonics. These harmonics, however, are not directly related to the instantaneous rotor speed, and are therefore attenuated in some embodiments through the use of a digital filter in the rotor slot harmonic frequency detector 24.

While the bandwidth of the digital filter may be empirically determined by Carson's Rule, such a rule is derived from a single-tone angle-modulated signal and is intended to resolve a fundamental current component from the complex current, $i_{C,n}$, in the neighborhood of the rated fundamental frequency, $f_0$. In the rotor slot harmonic frequency detector 24, extensive filtering operation will typically call for a more precise quantification of the digital filter bandwidth because in the complex current, $i_{C,n}$, the amplitudes of rotor slot harmonics are far smaller than the amplitude of the fundamental current component. This is particularly true when the motor operates periodically time-varying loads and, hence, encounters significant load-induced rotor speed pulsations.

Figure 7:
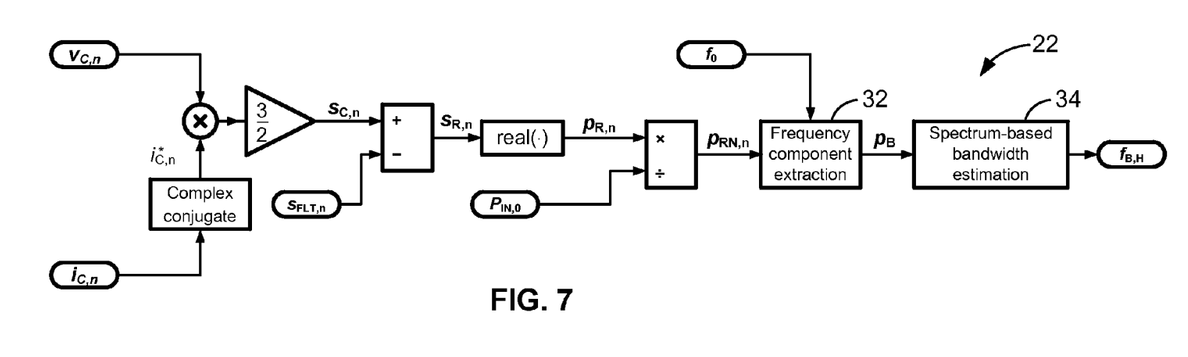
FIG. 7 is a schematic block diagram showing the structure of an exemplary filter bandwidth estimator.

Turning back to FIG. 1, the filter bandwidth estimator 22 receives the complex voltage, $v_{C,n}$, the complex current, $i_{C,n}$, the complex filtered power, $s_{FLT,n}$, and motor nameplate data as inputs, and produces an estimated filter bandwidth, $f_{B,H}$, as an output. FIG. 7 is a schematic block diagram showing the structure of an exemplary filter bandwidth estimator 22. The filter bandwidth estimator 22 of FIG. 7 is generally divided into three subsystems: (1) normalized residual power; (2) frequency component extraction; and (3) spectrum-based bandwidth estimation. By analyzing major frequency components in a normalized residual power, $p_{RN,n}$, the filter bandwidth estimator 22 provides a precise quantification of the filter bandwidth for designing a generalized linear-phase lowpass filter used in the subsequent rotor slot harmonic frequency detector 24.

Normalized Residual Power

The normalized residual power subsystem of the filter bandwidth estimator 22 of FIG. 7 computes a normalized residual power, $p_{RN,n}$, for example, from the complex voltage $v_{C,n}$, the complex current $i_{C,n}$, the complex filtered power $s_{FLT,n}$, and the rated input power $P_{IN,0}$.

First, a complex power, $s_{C,n}$, which is typically measured in Volt-Amps (VA), is calculated by multiplying the complex voltage, $v_{C,n}$, with the complex conjugate of the complex current, $i_{C,n}$. A constant coefficient (3/2 in FIG. 7) is included in the equation so that the complex power $s_{C,n}$ corresponds to a 3-phase quantity. The foregoing relationship is presented below in equation (12).

$$s_{C,n} = 3/2 \cdot v_{C,n} \cdot i^*_{C,n} \tag{12}$$

The normalized residual power $p_{RN,n}$ is:

$$p_{RN,n} = p_{R,n}/P_{IN,0} = \text{real}(s_{R,n})/P_{IN,0} = \text{real}(s_{C,n} - s_{FLT,n})/P_{IN,0} \tag{13}$$

where $s_{R,n} = s_{C,n} - s_{FLT,n}$, which is typically measured in Volt-Amps (VA), is a complex residual power, and $p_{R,n} = \text{real}(s_{R,n})$, which is typically measured in watts (W), is a real residual power.

In some embodiments, the normalized residual power, $p_{RN,n}$, is chosen because this quantity is closely associated with load oscillations and, hence, load-induced rotor speed pulsations in induction motors. Optionally, other quantities, such as the complex power, $s_{C,n}$, or the imaginary part of the complex residual power, $s_{R,n}$, may be chosen over the normalized residual power $p_{RN,n}$ when estimating the filter bandwidth.

Frequency Component Extraction

Figure 8:
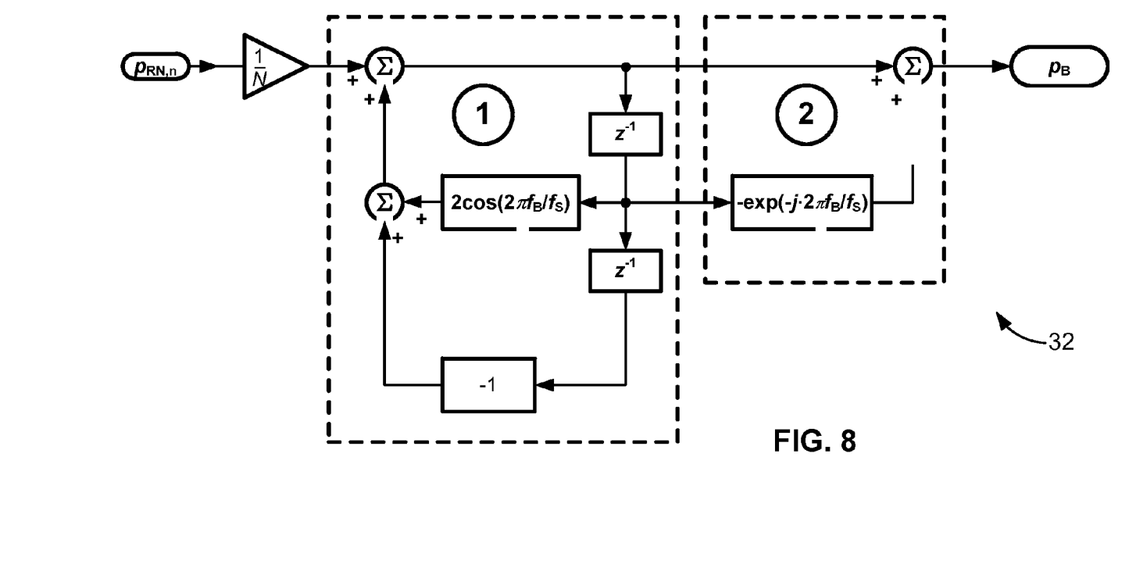
FIG. 8 is a schematic block diagram showing the Goertzel algorithm used when extracting a certain number of frequency components from an exemplary normalized residual power.

In the illustrated embodiment, the Goertzel Algorithm is employed to achieve a fast and efficient extraction of a certain number of frequency components from the normalized residual power, $p_{RN,n}$. FIG. 8 schematically illustrates a Goertzel Algorithm, designated generally as 32, for extracting frequency components from an exemplary normalized residual power. The Goertzel Algorithm 32 is generally moderate in terms of memory and data storage requirement. Other advantages of the Goertzel Algorithm 32, such as the ability to interleave the computation process with the data acquisition process, are outlined by Z. Gao, T. G. Habetler, and R. G. Harley, in "A complex space vector approach to rotor temperature estimation for line-connected induction machines with impaired cooling," IEEE Transactions on Industrial Electronics, Vol. 56, No. 1, pp. 239-247, January 2009, which is incorporated herein by reference in its entirety.

Loop 1 in FIG. 8, designated by the schematic elements inside the dashed rectangle on the left, is executed first. For a sequence of N-sample normalized residual power $p_{RN,n}$, i.e., $p_{RN,n}$ (n=0, 1, ..., N-1), loop 1 is executed N times. Once loop 1 is completed, the output therefrom is fed into loop 2, denoted by the schematic elements inside the dashed rectangle on the right in FIG. 8. In general, the complex multiplication by $-\exp(-j \cdot 2\pi f_B/f_S)$ needs to be executed only once for the whole sequence of N consecutive samples of normalized residual real power $p_{RN,n}$, i.e., n=0, 1, ..., N-1.

In some embodiments of the present disclosure, N is set to be equal to the sampling frequency, $f_S$. In this way, the frequency spectrum of normalized residual power $p_{RN,n}$ has a resolution of 1 Hz, i.e., adjacent frequency components in the frequency spectrum are separated by 1 Hz. Consequently, an integer value of $f_B$ in FIG. 8 corresponds to an integer multiple of 1 Hz, e.g., with the filter bandwidth $f_B$=15, the output of the Goertzel Algorithm $p_B$ corresponds to the 15-Hz component in $p_{RN,n}$.

In some applications, only a limited number of frequency components need to be extracted from the normalized residual power, $p_{RN,n}$, to determine the filter bandwidth, $f_B$, for the generalized linear-phase low-pass filter used in the subsequent rotor slot harmonic frequency detector 24. This involves setting $f_B$ in FIG. 8 to a range of integers between $f_{B,MIN}$ and $f_{B,MAX}$, and repeating the process outlined in this figure.

When a FIR filter of order M (M is even), which is essentially a digital filter with M+1 samples, is used as the generalized linear-phase low-pass filter in the subsequent rotor slot harmonic frequency detector 24, the minimum value of $f_{B,MIN}$ is determined by the order of this FIR filter:

$$f_{B,MIN} = \text{round}(f_S/M) \quad (14)$$

where round(·) rounds a real number to the nearest integer. For example, at a sampling frequency of $f_S$=5000 Hz, a FIR filter of order M=$f_S$/4=1250 results in $f_{B,MIN}$=4 Hz.

The maximum value of the filter bandwidth, $f_B$, is determined, for example, by necessity. In some embodiments of this disclosure, the relationship presented in equation (15), below, is adopted to exclude potential rotor-dynamic-eccentricity-related harmonics that are unrelated to the rotor slot harmonics.

$$f_{B,MAX} = \text{round}(f_0/P) \quad (15)$$

The frequency component extraction assigns positive integers between $f_{B,MIN}$ and $f_{B,MAX}$ to the filter bandwidth, $f_B$, and evaluates the corresponding frequency components $p_B$ from the N consecutive samples of the normalized residual power, $p_{RN,n}$, via the Goertzel Algorithm 32.

Spectrum-Based Bandwidth Estimation

The spectrum-based bandwidth estimation subsystem 34 of the filter bandwidth estimator 22 illustrated in FIG. 7 produces an estimated filter bandwidth, $f_{B,H}$, which is typically measured in hertz (Hz), by calculating an indicator, $p_C$, based on the output $p_B$ from the frequency component extraction subsystem 32:

$$p_C = sqrt\left[2 \cdot \sum_{B=f_{B,MIN}}^{C} (p_B)^2\right] \quad (16)$$

The subscript C in the indicator, $p_C$, is a positive integer with values between $f_{B,MIN}$ and $f_{B,MAX}$, inclusive. Because the frequency component extraction subsystem extracts the frequency components, $p_B$, from N consecutive samples of the normalized residual power, $p_{RN,n}$, with N=$f_S$, the subscript C is associated with the frequency, i.e., C=15 means that the indicator, $p_C$, contains cumulative power between $f_{B,MIN}$ and 15 Hz inclusive.

Figure 9A:
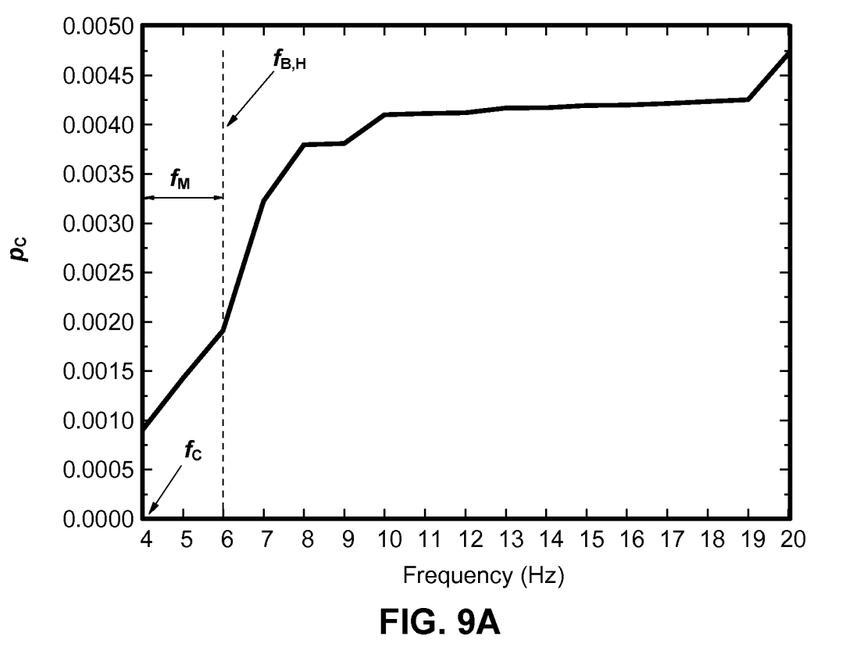
FIG. 9A is a graph showing the spectrum-based bandwidth estimation result for an exemplary 15-hp 6-pole induction motor with 44 rotor slots.
Figure 9B:
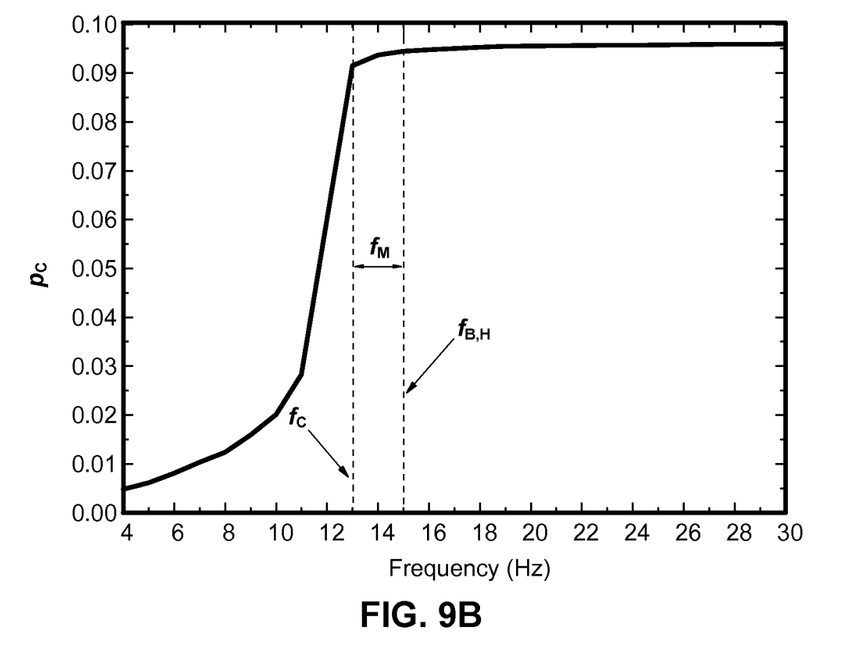
FIG. 9B is a graph showing the spectrum-based bandwidth estimation result for an exemplary 10-hp 4-pole induction motor with 44 rotor slots.

FIGS. 9A and 9B each show the spectrum-based bandwidth estimation result for a respective exemplary induction motor. In particular, FIG. 9A and FIG. 9B show representative plots of the indicator, $p_C$, for $f_{B,MIN} \leq C \leq f_{B,MAX}$. A sudden increase with a significant magnitude change, e.g., a magnitude change of more than 0.05, in $p_C$ at frequency $f_C$ (Hz) is generally associated with load-induced rotor speed pulsations in the induction motor, as seen in FIG. 9B. Depending, for example, on application-specific requirements, thresholds other than 0.05 may be selected instead. The spectrum-based bandwidth estimation subsystem 34 selects the estimated filter bandwidth, $f_{B,H}$, to accommodate such load-induced rotor speed pulsations. In case there is no such sudden increase with significant magnitude change in $p_C$, as seen in FIG. 9A, some embodiments equate $f_C$ to $f_{B,MIN}$. The following approach is adopted to determine the estimated filter bandwidth, $f_{B,H}$, with a certain marginal frequency, $f_M$, which is typically measured in hertz (Hz), i.e.:

$$f_{B,H} = f_C + f_M \quad (17)$$

In some embodiments, $f_M$=2 Hz. For example, according to FIG. 9A, the estimated filter bandwidth $f_{B,H}$=6 Hz for the exemplary 15-hp 6-pole induction motor with 44 rotor slots, and $f_{B,H}$=15 Hz for the exemplary 10-hp 4-pole induction motor with 44 rotor slots of FIG. 9B. Of course, based on the observation of the indicator, $p_C$, other rules may be designed in place of equation (17) to compute the estimated filter bandwidth, $f_{B,H}$.

To ensure that the dynamically varying carrier frequency $f_{X,n}$ generated by the carrier frequency tuning stage 20 is properly accommodated in the subsequent rotor slot harmonic frequency detector 24, the CSF filter bandwidth, $f_{B,CSF}$, in equation (7), above, should be coordinated with the estimated filter bandwidth, $f_{B,H}$, obtained from equation (17). The CSF filter bandwidth, $f_{B,CSF}$, should be sufficiently smaller than the estimated filter bandwidth, $f_{B,H}$. In some embodiments, the following relationship is adopted:

$$f_{B,CSF} \leq (f_{B,H}/10) \quad (18)$$

According to equation (7), it is equivalent to setting the coefficient adaptation rate, $\mu_W$, in the adaptive filtering subsystem to a value less than $(\pi \cdot f_{B,H})/(20 \cdot f_S)$.

Rotor Slot Harmonic Frequency Detector

According to aspects of the present disclosure, the rotor slot harmonic frequency detector 24 is based on a superheterodyne principle—the detector 24 extracts an instantaneous rotor slot harmonic frequency, $f_{H,n}$, which is typically measured in hertz (Hz), from the complex residual current $i_{R,n}$ by heterodyning the rotor slot harmonic to an intermediate frequency, and approximating a discrete-time derivative of the phase of the heterodyned signal.

Aside from the motor nameplate data, the inputs to the rotor slot harmonic frequency detector 24 include the anticipated rotor slot harmonic frequency, $f_{X,n}$, and the complex residual current $i_{R,n}$, received from the carrier frequency tuning stage 20, and the estimated filter bandwidth $f_{B,H}$, received from the filter bandwidth estimator 22. The rotor slot harmonic frequency detector 24 produces the instantaneous rotor slot harmonic frequency, $f_{H,n}$, as an output. In the illustrative example shown in FIG. 10, the rotor slot harmonic frequency detector 24 is divided into six subsystems: (1) adaptive notch filter 40; (2) voltage-controlled oscillator 42; (3) frequency mixer 44; (4) generalized linear-phase low-pass filter 46; (5) frequency demodulator 48; and (6) latency compensator 50.

Adaptive Notch Filter

Because power system harmonics often interfere with the rotor slot harmonics, and degrade the performance of the rotor slot harmonic frequency detector, an adaptive notch filter subsystem 40 is used, for example, to improve the overall performance of the rotor slot harmonic frequency detector 24. The adaptive notch filter subsystem utilizes a CSF filter to attenuate a power system harmonic at, $f_P$, which is typically measured in hertz (Hz), which is in the neighborhood of the rotor slot harmonic of interest. The adaptive notch filter 40 takes the complex residual current, $i_{R,n}$, and the rated fundamental frequency, $f_0$, as inputs, and produces a complex notched current, $i_{T,n}$, which is typically measured in amperes (A), as an output.

Figures 10, 11:
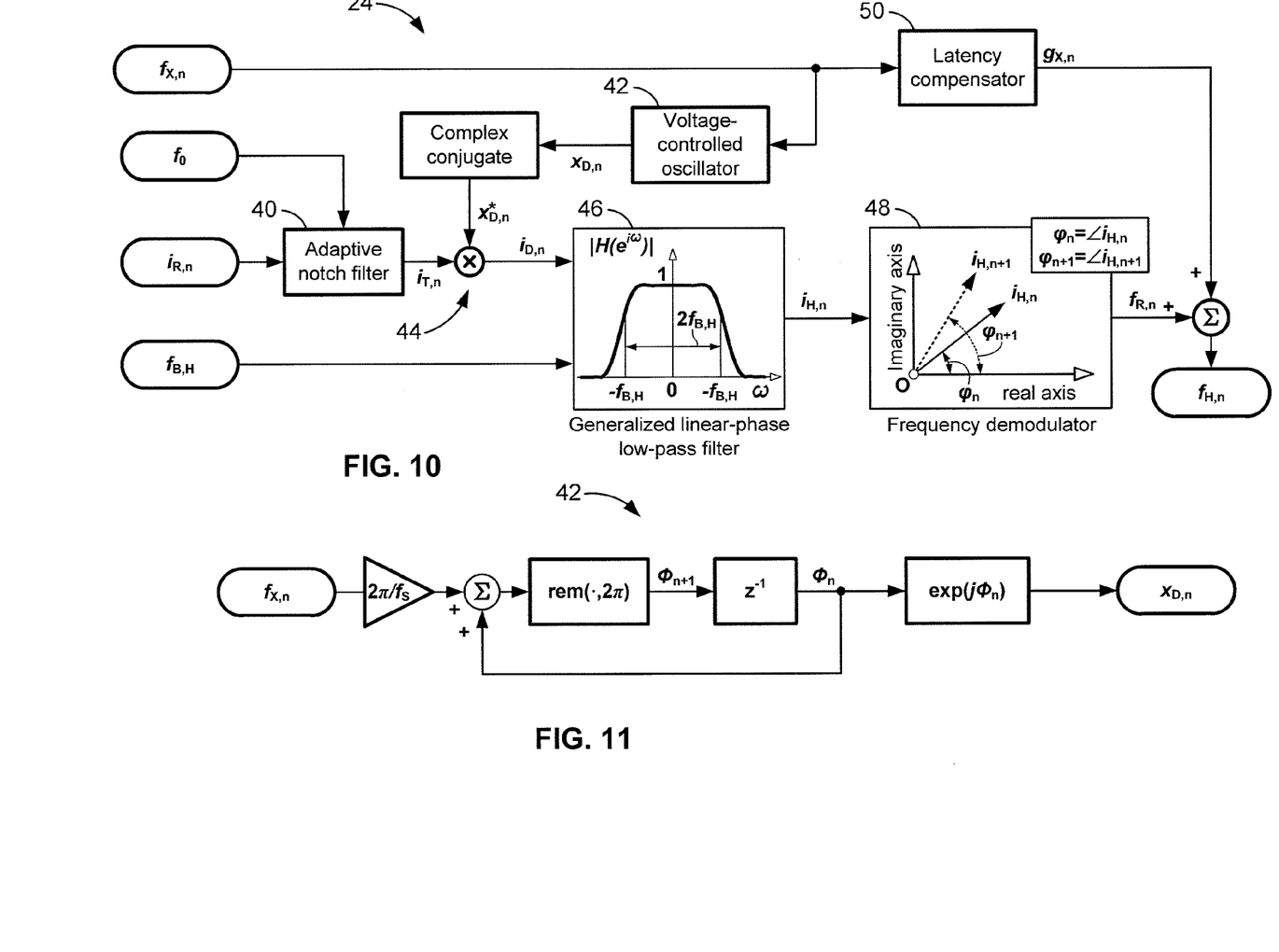
FIG. 10 is a schematic block diagram showing the structure of an exemplary rotor slot harmonic frequency detector.
FIG. 11 is a schematic block diagram showing the structure of an exemplary voltage-controlled oscillator.

Referring back to FIG. 4, when the complex error signal is selected as the output, the CSF filter is effectively a notch filter at the synthesis frequency, $f_{IN}$. In the adaptive notch filter subsystem 40 of FIG. 10, the synthesis frequency, $f_{IN}$, is equal to the power system harmonic frequency, $f_P$, at an integer multiple of the rated fundamental frequency $f_0$:

$$f_P = \pm f_0 \cdot \text{round}(kR/P + n_W) \quad (19)$$

where quantities take same values as their counterparts in equation (11), above. The CSF filter used in the adaptive notch filter 40 takes the complex residual current, $i_{R,n}$, as the complex primary signal $d_n$. The complex notched current $i_{T,n}$ is the complex error signal $e_n$ from this CSF filter. As noted above, the CSF filter usually has a start-up transient caused by a small coefficient adaptation rate, $\mu_W$, and a zero complex coefficient, $w_0$. This issue can be addressed by discarding the output of the CSF filter that corresponds to this start-up transient. This output is normally in the duration of one tenth of a second to tens of seconds.

When a motor operates at a no load or close to a no load condition, the amplitudes of rotor slot harmonics become negligibly small and may overlap with the power system harmonics. In this case, the output of the rotor slot harmonic frequency detector 24 may be fraught with estimation errors, and consequently may be discarded without inadvertently disposing of useful motor speed-related information.

Voltage-Controlled Oscillator

FIG. 11 shows the structure of an exemplary voltage-controlled oscillator (VCO) 42. The VCO 42 receives the anticipated rotor slot harmonic frequency, $f_{X,n}$, as an input, and synthesizes a complex exponential signal $x_{D,n}$ as its output at nth sample. Operation of the VCO is generally characterized by the following two equations:

$$x_{D,n} = \exp(j \cdot \Phi_n) \quad (20)$$

$$\Phi_{n+1} = \text{rem}(\Phi_n + 2\pi \cdot f_{X,n}/f_S, 2\pi) \quad (21)$$

where $\text{rem}(\Phi_n + 2\pi \cdot f_{X,n}/f_S, 2\pi)$ denotes the remainder of $(\Phi_n + 2\pi \cdot f_{X,n}/f_S)$ after it is divided by $2\pi$. This equation effectively wraps the phase $\Phi_{n+1}$ to a value between 0 and $2\pi$, and hence avoids arithmetic overflow. This technique may also be applied to other places, such as the exponent in equation (5).

Because the anticipated rotor slot harmonic frequency, $f_{X,n}$, is used as the carrier frequency, the generated complex exponential signal, $x_{D,n}$, thus has a dynamically varying instantaneous frequency.

Frequency Mixer

The frequency mixer, designated generally as 44 in FIG. 10, of the rotor slot harmonic frequency detector 24 multiplies the complex notched current, $i_{T,n}$, with the complex conjugate of the complex exponential signal, $x_{D,n}$, to form a complex mixed signal, $i_{D,n}$, which is typically measured in amperes (A), as indicated below in equation (22).

$$i_{D,n} = i_{T,n} \cdot x_{D,n}^* \quad (22)$$

The frequency mixer effectively heterodynes the rotor slot harmonic in the complex notched current, $i_{T,n}$, to an intermediate frequency and, thus, simplifies the subsequent processing.

Generalized Linear-Phase Low-Pass Filter

The generalized linear-phase low-pass filter 46, with a cutoff frequency of $f_{B,H}$, receives the complex mixed signal, $i_{D,n}$, from the frequency mixer 44 as an input, and produces a complex baseband signal, $i_{H,n}$, which is typically measured in amperes (A), as an output. The generalized linear-phase low-pass filter 46 is used to attenuate out-of-band interference and noise associated with the motor, including power system harmonics and rotor-dynamic-eccentricity-related harmonics. Signals between $-f_{B,H}$ and $f_{B,H}$ in the complex mixed signal, $i_{D,n}$, are retained, while signals beyond this range are attenuated.

FIR filters can be used to implement generalized linear-phase low-pass filters. Kaiser window design technique may be used to design such FIR filters. Carefully designed IIR Bessel filters with approximately linear phase within $[-f_{B,H}\ f_{B,H}]$ may also be used. Compared with their FIR counterparts, the IIR filters usually offer similar performance with smaller computational burden.

The generalized linear-phase low-pass filter 46 usually has a start-up transient caused by a zero initial condition in the filter's internal states. This issue can be addressed by discarding the output of the filter 46 that corresponds to this start-up transient.

Frequency Demodulator

The frequency demodulator 48 of FIG. 10 utilizes a numerical differentiator to compute a residual rotor slot harmonic frequency, $f_{R,n}$, which is typically measured in hertz (Hz), from the complex baseband signal, $i_{H,n}$. Denoting $\phi_n$ as the phase of the complex baseband signal, $i_{H,n}$, i.e., $\phi_n = \angle i_{H,n}$, the residual rotor slot harmonic frequency, $f_{R,n}$, is computed via a five-point numerical differentiator formula:

$$f_{R,n} = (-\phi_n + 8 \cdot \phi_{n-1} - 8 \cdot \phi_{n-3} + \phi_{n-4}) \cdot f_S / (24\pi) \quad (23)$$

Other methods, such as the forward- or back-ward difference formula, three-point formulas, Kaiser window-based discrete-time differentiators, or even a phase discriminator, may also be used as a substitute of equation (23) when computing the residual rotor slot harmonic frequency $f_{R,n}$. Kaiser window-based discrete-time differentiators are disclosed in U.S. Pat. No. 7,769,552, which was previously incorporated herein by reference. Phase discriminators are disclosed in U.S. Patent Appl. Publ. No. 2009/0284212, which was previously incorporated herein by reference. The some embodiments, equation (23) is desirable because of its simplicity and superior accuracy. However, equation (23) is nonetheless an approximation to the continuous-time derivative of the phase of the complex baseband signal, $i_{H,n}$; therefore, an approximation error that is proportional to $1/f_S^4$ exists in the residual rotor slot harmonic frequency $f_{R,n}$.

Latency Compensator

A causal signal processing method, like the generalized linear-phase low-pass filter 46 or the frequency demodulator 48, usually incurs an associated time shift, or latency, along the processing path between its input and output. A latency compensator 50 compensates for the time shift introduced by such causal signal processing methods.

Figure 12A:
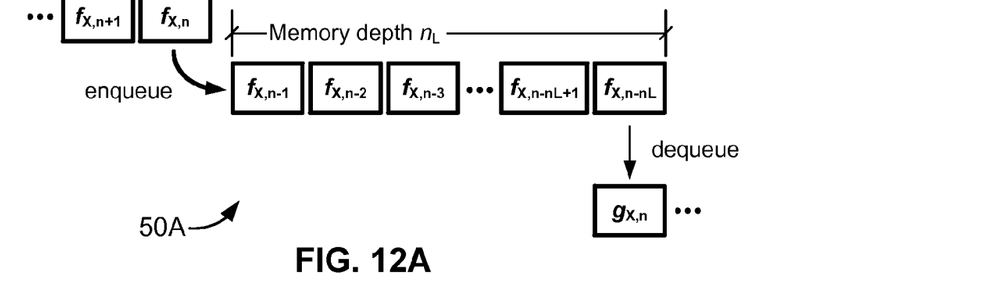
FIG. 12A is a schematic block diagram showing the structure of an exemplary latency compensator at the nth sample.
Figure 12B:
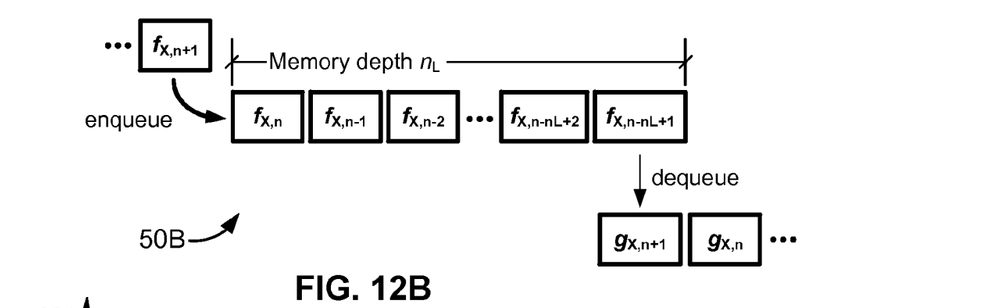
FIG. 12B is a schematic block diagram showing the structure of an exemplary latency compensator at the (n+1)th sample.

The latency compensator 50 illustrated in FIG. 10 synchronizes the anticipated rotor slot harmonic frequency, $f_{X,n}$, and the residual rotor slot harmonic frequency, $f_{R,n}$, to the same epoch before the instantaneous rotor slot harmonic frequency, $f_{H,n}$, is resolved. FIG. 12A is a block diagram showing the structure of an exemplary latency compensator 50A at the nth sample, while FIG.12B is a block diagram showing the structure of an exemplary latency compensator 50B at the (n+1)th sample. The latency compensator 50A of FIG. 12A is a first-in first-out queue with a memory depth of $n_L$ samples ($n_L$ is a nonnegative integer). Denoted by a delay(·) operator in equation (24), below, an output of the latency compensator at the nth sample, $g_{X,n}$, is the (n-$n_L$)th sample of its input $f_{X,n}$:

$$g_{X,n} = \text{delay}(f_{X,n}, n_L) = f_{X,n} z^{-nL} = f_{X,n-nL} \quad (24)$$

where $z^{-nL}$ denotes a delay of $n_L$ samples in the z-transform. In some embodiments, the latency compensator 50 takes the form of a circular buffer. Implementation of the latency compensator 50 may take forms other than a circular buffer.

The memory depth $n_L$ is determined, for example, by structures of the generalized linear-phase low-pass filter 46 and the frequency demodulator 48 of FIG. 10. For an appropriately designed generalized linear-phase low-pass filter 46, the time delay introduced by the filter corresponds to the filter's group delay, $n_{grd}$. For example, for the aforementioned FIR filter with the filter order of M (M is even), its group delay is $n_{grd}$=M/2. In addition, the frequency demodulator 48 based on equation (23), above, introduces a 2-sample delay between input and output. Therefore, the memory depth of the latency compensator 50 is:

$$n_L = n_{grd} + 2 = (M/2) + 2 \quad (25)$$

This memory depth may take a different value if an IIR filter is used instead of the aforementioned FIR filter. It may also take a different value if the frequency demodulator uses a formula other than equation (23).

Finally, the instantaneous rotor slot harmonic frequency, $f_{H,n}$ is computed as the sum of $g_{X,n}$ and the residual rotor slot harmonic frequency $f_{R,n}$:

$$f_{H,n} = g_{X,n} + f_{R,n} \quad (26)$$

Figure 13:
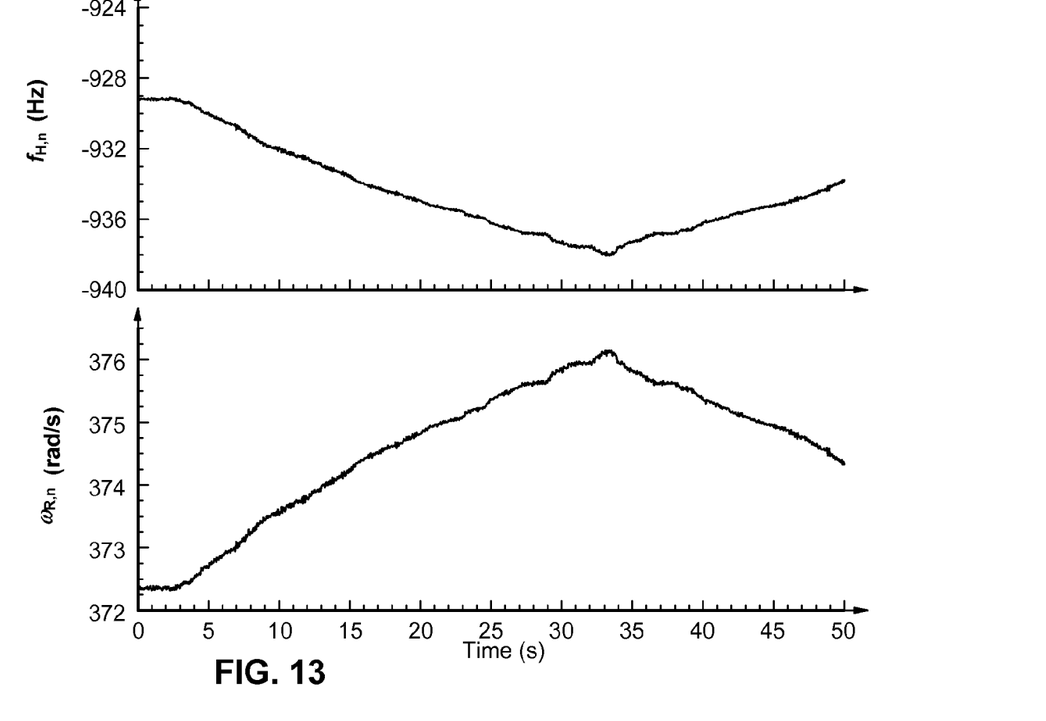
FIG. 13 is a two-part graph plotting an exemplary instantaneous rotor slot harmonic frequency and instantaneous rotor speed against time.

The instantaneous rotor slot harmonic frequency $f_{H,n}$ may be used to compute the instantaneous rotor speed, $\omega_{R,n}$ (in radians per second), for the induction motor. For motors connected to a three-phase power supply with a fixed supply frequency at the rated fundamental frequency, $f_0$, the instantaneous rotor speed $\omega_{R,n}$ is:

$$\omega_{R,n} = 2\pi P \cdot (\pm f_{H,n} - n_w f_0)/(kR) \quad (27)$$

where quantities takes same values as their counterparts in equation (11). For example, FIG. 13 shows the instantaneous rotor slot harmonic frequency, $f_{H,n}$, for the exemplary 15-hp 6-pole induction motor with 44 rotor slots. The instantaneous rotor speed $\omega_{R,n}$ for the exemplary 15-hp 6-pole induction motor is also illustrated in FIG. 13.

This instantaneous rotor speed, $\omega_{R,n}$, provides foundation to many motor condition monitoring, diagnosis, and protection applications, such as real-time tracking of an induction motor's rotor temperature, induction motor electrical parameters estimation, and/or assessment of in-service induction motor's energy efficiency.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method for demodulating instantaneous rotor slot harmonic frequency for a polyphase induction motor, the method comprising:
  receiving measurements indicative of at least one voltage and at least one current associated with the induction motor;
  converting the voltage measurements to discrete-time voltage samples and the current measurements to discrete-time current samples;
  determining a complex voltage from the discrete-time voltage samples and a complex current from the discrete-time current samples;
  receiving motor nameplate data associated with the motor;
  determining a dynamically varying carrier frequency;
  determining an estimated filter bandwidth;
  demodulating the instantaneous rotor slot harmonic frequency based, at least in part, on the dynamically varying carrier frequency, the estimated filter bandwidth, and the motor nameplate data; and
  storing the demodulated instantaneous rotor slot harmonic frequency;
  wherein the determining the dynamically varying carrier frequency includes determining an anticipated rotor slot harmonic frequency based, at least in part, upon the complex voltage, the complex current, and the motor nameplate data.

2. The method of claim 1, wherein the determining the anticipated rotor slot harmonic frequency includes processing the complex voltage via a first complex single frequency (CSF) filter to produce a complex filtered voltage, and processing the complex current via a second CSF filter to produce a complex filtered current.

3. The method of claim 2, wherein the first and second CSF filters have a filter group delay of approximately zero at a synthesis frequency.

4. The method of claim 2, wherein the determining the anticipated rotor slot harmonic frequency includes determining a normalized input power from the complex filtered voltage, the complex filtered current, and a rated input power associated with the motor.

5. The method of claim 4, wherein the determining the anticipated rotor slot harmonic frequency includes determining an approximate slip of the motor based, at least in part, on the normalized input power, a rated slip associated with the motor, and at least one motor-specific coefficient related to the motor.

6. The method of claim 1, further comprising synchronizing the anticipated rotor slot harmonic frequency and a residual rotor slot harmonic frequency associated with the motor via a latency compensator.

7. The method of claim 1, wherein the determining the estimated filter bandwidth is based, at least in part, upon the complex voltage, the complex current, a complex filtered power associated with the motor, and the motor nameplate data.

8. The method of claim 7, wherein the determining the estimated filter bandwidth includes analyzing a frequency spectrum of a normalized residual power determined, at least in part, from the complex voltage, the complex current, the complex filtered power, a rated input power associated with the motor, and a rated fundamental frequency associated with the motor.

9. The method of claim 8, wherein the determining the estimated filter bandwidth includes extracting a predetermined limited number of frequency components from the normalized residual power.

10. The method of claim 8, wherein the determining the estimated filter bandwidth includes calculating an indicator based on the output from a frequency component extraction, the frequency component extraction including a Goertzel Algorithm.

11. The method of claim 8, wherein a complex single frequency filter bandwidth is set to be sufficiently smaller than the estimated filter bandwidth.

12. The method of claim 1, wherein the demodulating the instantaneous rotor slot harmonic frequency is carried out by a rotor slot harmonic frequency detector.

13. The method of claim 12, wherein the rotor slot harmonic frequency detector extracts the instantaneous rotor slot harmonic frequency from a complex residual current by heterodyning a rotor slot harmonic to an intermediate frequency, and approximating a discrete-time derivative of the phase of the heterodyned rotor slot harmonic.

14. The method of claim 1, further comprising determining a complex notched current based, at least in part, upon a complex residual current associated with the motor and a rated fundamental frequency associated with the motor.

15. The method of claim 1, further comprising attenuating out-of-band interference and noise associated with the motor via a generalized linear-phase low-pass filter.

16. The method of claim 1, wherein the voltage measurements are taken either from at least two phases with respect to a third phase or from the at least two phases with respect to an arbitrary voltage reference point, and wherein the current measurements are taken from the at least two phases.

17. The method of claim 1, wherein the motor nameplate data includes a rated voltage of the motor, a rated current of the motor, a number of rotor slots of the motor, a rated slip of the motor, a rated power factor of the motor, a rated fundamental frequency of the motor, or a rated speed of the motor, or any combination thereof.

18. A method for demodulating instantaneous rotor slot harmonic frequency for at least one line-connected squirrel-cage polyphase induction motor, the method comprising:
    measuring voltages and currents associated with the induction motor;
    converting, via at least one analog-to-digital converter, the measured voltages to discrete-time voltage samples and the measured currents to discrete-time current samples;
    synthesizing a complex voltage from the discrete-time voltage samples;
    synthesizing a complex current from the discrete-time current samples;
    acquiring motor nameplate data associated with the motor;
    storing the acquired motor nameplate data;
    calculating a dynamically varying carrier frequency based, at least in part, on the complex voltage, the complex current, and the motor nameplate data according to a correlation between an input power and a rotor slot harmonic frequency associated with the motor;
    determining an estimated filter bandwidth by analyzing a frequency spectrum of a normalized residual power computed, at least in part, from the complex voltage and the complex current;
    demodulating the instantaneous rotor slot harmonic frequency via a rotor slot harmonic frequency detector based, at least in part, on the dynamically varying carrier frequency and the estimated filter bandwidth; and
    storing the demodulated instantaneous rotor slot harmonic frequency.

* * * * *